United States Patent
Xu (10) Patent No.: US 11,211,129 B2
(45) Date of Patent: Dec. 28, 2021

(54) NONCONSECUTIVE SENSING OF MULTILEVEL MEMORY CELLS

(71) Applicant: Micron Technology, Inc., Boise, ID (US)

(72) Inventor: Jun Xu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/054,206

(22) Filed: Aug. 3, 2018

(65) Prior Publication Data
US 2018/0342303 A1 Nov. 29, 2018

Related U.S. Application Data

(63) Continuation of application No. 14/935,744, filed on Nov. 9, 2015, now Pat. No. 10,153,047, which is a continuation of application No. 14/122,577, filed as application No. PCT/CN2012/000314 on Mar. 13, 2012, now Pat. No. 9,190,162.

(51) Int. Cl.
*G11C 16/26* (2006.01)
*G11C 11/56* (2006.01)

(52) U.S. Cl.
CPC .............. *G11C 16/26* (2013.01); *G11C 11/56* (2013.01); *G11C 11/5642* (2013.01)

(58) Field of Classification Search
CPC .......................... G11C 16/26; G11C 16/0483
See application file for complete search history.

(56) References Cited

U.S. PATENT DOCUMENTS

| | | | |
|---|---|---|---|
| 6,038,166 A | * | 3/2000 | Wong ................. G11C 11/5621 365/185.03 |
| 7,092,290 B2 | | 8/2006 | Hemink |
| 7,139,205 B1 | | 11/2006 | Goldman et al. |
| 7,359,240 B2 | | 4/2008 | Lee et al. |
| 7,466,598 B2 | | 12/2008 | Park |
| 7,848,142 B2 | | 12/2010 | Radke |
| 8,027,195 B2 | | 9/2011 | Li et al. |
| 8,077,515 B2 | | 12/2011 | Shen et al. |

(Continued)

OTHER PUBLICATIONS

Eitan, B. et al. "4-bit per cell NROM reliability", Electron Devices Meeting 2005, Dec. 5, 2005, pp. 539-542, Washington, D.C.

*Primary Examiner* — Alfredo Bermudez Lozada
(74) *Attorney, Agent, or Firm* — Brooks, Cameron & Huebsch, PLLC (57) ABSTRACT

Apparatuses and methods for nonconsecutive sensing of multilevel memory cells include methods of sensing a unit of information from a multilevel memory cell (MLC) using a sensing signal. The unit of information can correspond to a page of information. The MLC can store a plurality of units of information corresponding to a plurality of pages of information. The sensing signal can change from a first sensing magnitude to a second sensing magnitude and from the second sensing magnitude to a third sensing magnitude. The second sensing magnitude can be nonconsecutive from the first sensing magnitude and/or the third sensing magnitude can be nonconsecutive from the second sensing magnitude with respect to a plurality of sensing magnitudes corresponding to a plurality of charge storage states of the MLC.

17 Claims, 6 Drawing Sheets

| | | A | B | C | D | E | F | G | H |
|---|---|---|---|---|---|---|---|---|---|
| | SENSE1 --> BIT2 | 1 | 1 | 1 | 1 | 0 | 0 | 0 | 0 |
| 520 | SENSE2 --> BIT1 | 1 | 1 | 0 | 0 | 0 | 1 | 1 | 0 |
| | SENSE3 --> BIT0 | 1 | 0 | 0 | 1 | 1 | 1 | 0 | 0 |

516 — 518

(56) References Cited

U.S. PATENT DOCUMENTS

| | | |
|---|---|---|
| 8,638,607 B2 | 1/2014 | Sarpatwari et al. |
| 9,190,174 B2 | 11/2015 | Parthasarathy et al. |
| 2005/0169057 A1 | 8/2005 | Shibata et al. |
| 2009/0106485 A1* | 4/2009 | Anholt .................. G11C 16/28 711/103 |
| 2009/0109745 A1* | 4/2009 | Aritome .............. G11C 11/5642 365/185.03 |
| 2010/0080056 A1* | 4/2010 | Shiga .................. G06F 11/1072 365/185.03 |
| 2010/0259993 A1 | 10/2010 | Kang |
| 2011/0063906 A1 | 3/2011 | Sarin et al. |
| 2011/0161775 A1* | 6/2011 | Weingarten ......... G06F 11/1048 714/755 |
| 2011/0225472 A1 | 9/2011 | Sommer et al. |
| 2011/0280069 A1 | 11/2011 | Patapoutian et al. |
| 2012/0134207 A1* | 5/2012 | Yoon .................. G11C 11/5642 365/185.03 |
| 2012/0163085 A1* | 6/2012 | Alrod ................. G06F 11/1072 365/185.18 |

\* cited by examiner

| | A | B | C | D | E | F | G | H |
|---|---|---|---|---|---|---|---|---|
| SENSE1 --> BIT2 | 1 | 1 | 1 | 1 | 0 | 0 | 0 | 0 |
| SENSE2 --> BIT1 | 1 | 1 | 0 | 0 | 0 | 1 | 1 | 0 |
| SENSE3 --> BIT0 | 1 | 0 | 0 | 1 | 1 | 1 | 0 | 0 |

|  C1<br>C0 | A | | | | | B | | | | | C | | | | | D | | | | | E | | | | | F | | | | |
|---|---|---|---|---|---|---|---|---|---|---|---|---|---|---|---|---|---|---|---|---|---|---|---|---|---|---|---|---|---|---|
| a | 1 | 1 | 1 | 1 | 1 | 1 | 1 | 0 | 1 | 1 | 0 | 1 | 0 | 1 | 1 | 0 | 1 | 1 | 1 | 1 | 0 | 1 | 1 | 1 | 0 | 1 | 1 | 1 | 1 | 0 |
| b | 1 | 1 | 1 | 0 | 1 | 1 | 1 | 0 | 0 | 1 | 0 | 1 | 0 | 0 | 1 | 0 | 1 | 1 | 0 | 1 | 0 | 1 | 1 | 0 | 0 | 1 | 1 | 1 | 0 | 0 |
| c | 1 | 0 | 1 | 0 | 1 | 1 | 0 | 0 | 0 | 1 | 0 | 0 | 0 | 0 | 1 | 0 | 0 | 1 | 0 | 1 | 0 | 0 | 1 | 0 | 0 | 1 | 0 | 1 | 0 | 0 |
| d | 1 | 0 | 1 | 1 | 1 | 1 | 0 | 0 | 1 | 1 | 0 | 0 | 0 | 1 | 1 | 0 | 0 | 1 | 1 | 1 | 0 | 0 | 1 | 1 | 0 | 1 | 0 | 1 | 1 | 0 |
| e | 1 | 0 | 1 | 1 | 0 | 1 | 0 | 0 | 0 | 0 | 0 | 0 | 0 | 1 | 0 | 0 | 0 | 1 | 1 | 0 | 0 | 0 | 0 | 0 | 0 | 1 | 0 | 0 | 0 | 0 |
| f | 1 | 1 | 1 | 1 | 0 | 1 | 1 | 0 | 1 | 0 | 0 | 1 | 0 | 1 | 0 | 0 | 1 | 1 | 1 | 0 | 0 | 1 | 0 | 0 | 0 | 1 | 1 | 0 | 0 | 0 |

◨ RESOLVED BY S1  ▨ RESOLVED BY S2  ☐ RESOLVED BY S1 | S2  ⸬ DUPLICATED STATUS

*Fig. 7*

NONCONSECUTIVE SENSING OF MULTILEVEL MEMORY CELLS

PRIORITY INFORMATION

This application is a Continuation of U.S. application Ser. No. 14/935,744, filed Nov. 9, 2015, which is a Continuation of U.S. application Ser. No. 14/122,577, filed Mar. 7, 2014, that issued as U.S. Pat. No. 9,190,162 on Nov. 17, 2015, which is a National Stage application of PCT/CN2012/000314, filed Mar. 13, 2012, the contents of which are incorporated herein by reference.

TECHNICAL FIELD

The present disclosure relates generally to semiconductor memory and methods, and more particularly, to apparatuses and methods for nonconsecutive sensing of multilevel memory cells.

BACKGROUND

Memory devices are typically provided as internal, semiconductor, integrated circuits in computers or other electronic devices. There are many different types of memory including volatile and non-volatile memory. Volatile memory can require power to maintain its information (e.g., data, error information, etc.) and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a solid state drive (SSD). A solid state drive can include non-volatile memory (e.g., NAND flash memory and NOR flash memory) and/or can include volatile memory (e.g., DRAM and SRAM) among various other types of non-volatile and volatile memory. Flash memory devices can include a charge storage structure, such as is included in floating gate flash devices and charge trap flash (CTF) devices, which may be utilized as non-volatile memory for a wide range of electronic applications. Flash memory devices may use a one-transistor memory cell that allows for high memory densities, high reliability, and low power consumption.

Memory cells in an array architecture can be programmed to a target charge storage state. For example, electric charge can be placed on or removed from the floating gate of a memory cell to put the cell into one of a number of charge storage states. For example, a single level cell (SLC) can be programmed to one of two charge storage states representing one of two units of information (e.g., 1 or 0). Multilevel memory cells (MLCs) can be programmed to one of more than two charge storage states. For example, an MLC capable of storing two units of information can be programmed to one of four charge storage states, an MLC capable of storing three units of information can be programmed to one of eight charge storage states, and an MLC capable of storing four units of information can be programmed to one of sixteen charge storage states. MLCs can allow the manufacture of higher density memories without increasing the number of memory cells since each cell can represent more than one unit of information, e.g., more than one bit. However, storing an increasing number of units of information in an MLC may increase a sensing time to resolve the stored units of information.

DETAILED DESCRIPTION

The present disclosure includes apparatuses and methods for nonconsecutive sensing of multilevel memory cells. A number of methods include sensing a unit of information from a multilevel memory cell (MLC) using a sensing signal. The unit of information can correspond to a page of information. The MLC can store a plurality of units of information corresponding to a plurality of pages of information. The sensing signal can change from a first sensing magnitude to a second sensing magnitude and from the second sensing magnitude to a third sensing magnitude. The second sensing magnitude can be nonconsecutive from the first sensing magnitude and/or the third sensing magnitude can be nonconsecutive from the second sensing magnitude with respect to a plurality of sensing magnitudes corresponding to a plurality of charge storage states of the MLC.

Some previous approaches to sensing MLCs have included increasing a magnitude of a sensing signal and allowing it to settle at a sensing magnitude between each of the charge storage states of the MLC. Such previous approaches can be time-intensive, particularly for MLCs that can be programmed to a large number of charge storage states. In contrast, a number of embodiments of the present disclosure can read information (e.g., a page of information, or a portion thereof) from an MLC by changing a magnitude of a sensing signal through less than all of the sensing magnitudes between charge storage states, thereby reducing an amount of time that would otherwise be used to sense the MLC.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 516 may reference element "16" in FIG. 5, and a similar element may be referenced as 716 in FIG. 7. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
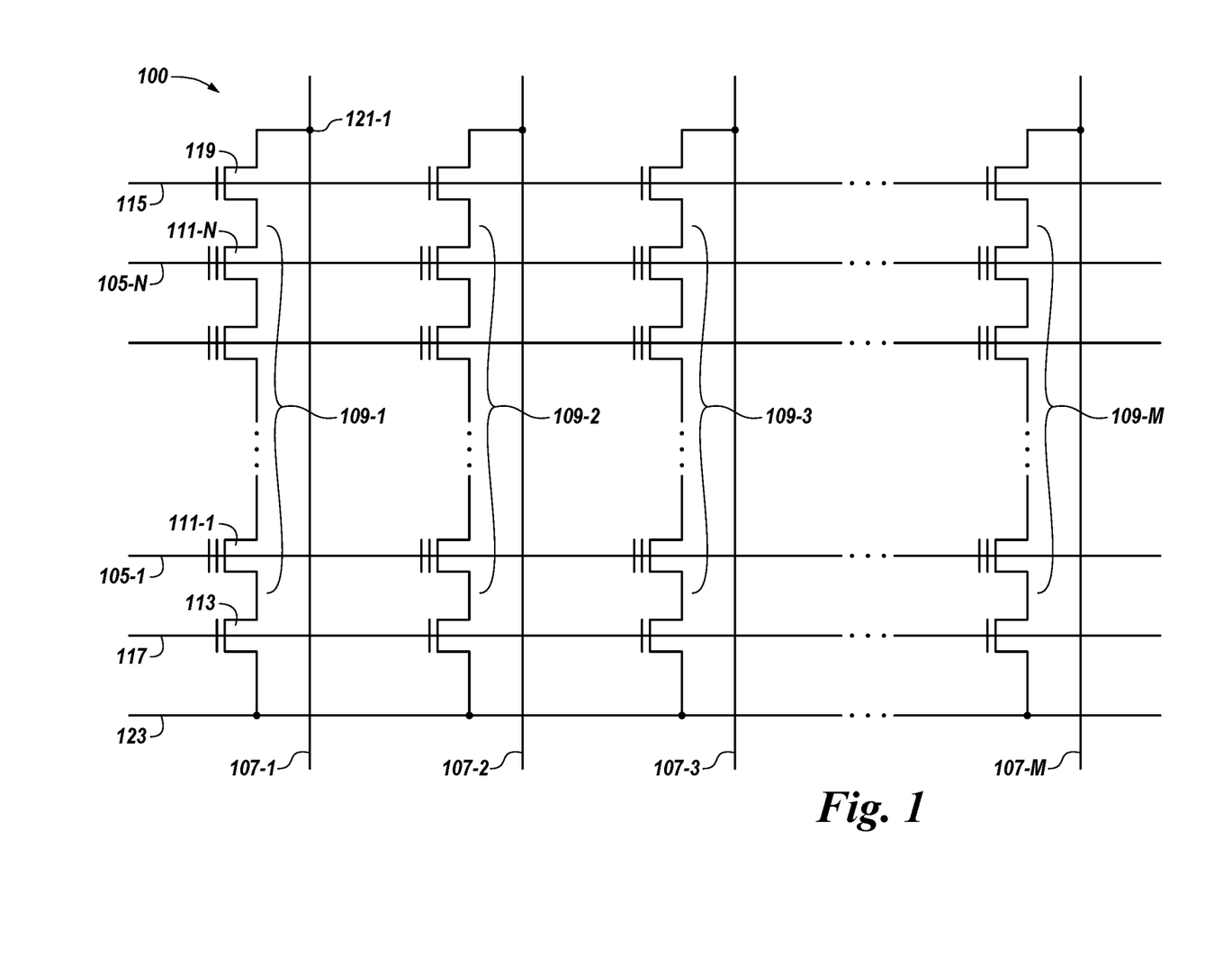
FIG. 1 illustrates a schematic diagram of a portion of a non-volatile memory array in accordance with a number of embodiments of the present disclosure.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines 105-1, . . . , 105-N) and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The memory cells 111-1, . . . , 111-N of each NAND string 109-1, 109-2, 109-3, . . . , 109-M are connected in series source to drain between a source select gate (SGS) (e.g., a field-effect transistor (FET) 113) and a drain select gate (SGD) (e.g., FET 119). Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of the non-volatile memory cells 111-1, . . . , 111-N includes a source, a drain, a floating gate or other charge storage structure, and a control gate. The memory cells 111-1, . . . , 111-N have their control gates coupled to a word line, 105-1, . . . , 105-N, respectively. A NOR array architecture would be similarly laid out, except that the string of memory cells would be coupled in parallel between the select gates. Furthermore, a NOR architecture can provide for random access (e.g., sensing) to the memory cells in the array (e.g., as opposed to page-based access as with a NAND architecture).

A number (e.g., a subset or all) of cells coupled to a selected word line (e.g., 105-1, . . . , 105-N) can be programmed and/or sensed (e.g., read) together as a group. A number of cells programmed and/or sensed together can correspond to a page of information. In association with a sensing operation, a number of cells coupled to a particular word line and programmed together to respective charge storage states can be referred to as a target page. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a targeted charge storage state.

A sensing operation, such as a read or program verify operation, can include sensing a voltage and/or current change of a bit line coupled to a selected cell in order to determine the charge storage state of the selected cell. The sensing operation can include precharging a bit line and sensing the discharge when a selected cell begins to conduct.

Sensing the charge storage state of a selected cell can include providing a number of sensing signals (e.g., read voltages) to a selected word line while providing a number of voltages (e.g., read pass voltages) to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing signal applied to the selected word line. For example, the charge storage state of a selected cell can be determined by the word line voltage at which the bit line current reaches a particular reference current associated with a particular state.

Figure 2:
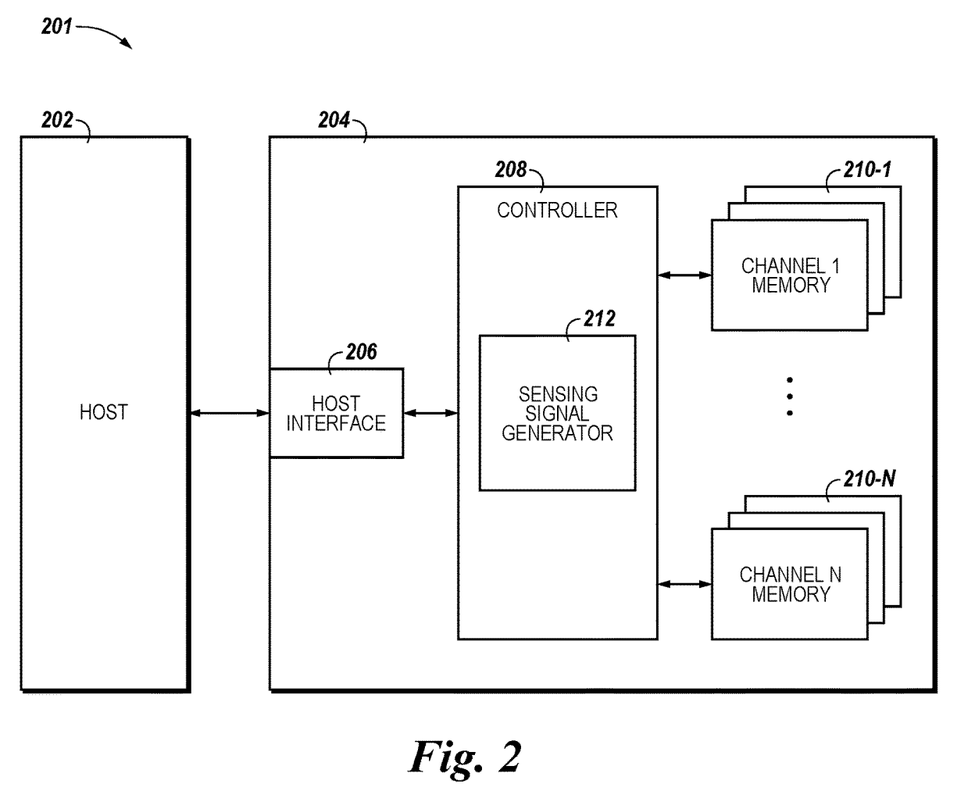
FIG. 2 illustrates a block diagram of an apparatus in the form of a computing system including at least one memory system in accordance with a number of embodiments of the present disclosure.

FIG. 2 illustrates a block diagram of an apparatus in the form of a computing system 201 including at least one memory system 204 in accordance with a number of embodiments of the present disclosure. As used herein, a memory system 204, a controller 208, or a memory device 210 might also be separately considered an "apparatus." The memory system 204 can be a solid state drive (SSD), for instance, and can include a host interface 206, a controller 208 (e.g., a processor and/or other control circuitry), and a number of memory devices 210-1, . . . , 210-N (e.g., solid state memory devices such as NAND flash devices), which provide a storage volume for the memory system 204.

As illustrated in FIG. 2, the controller 208 can be coupled to the host interface 206 and to the memory devices 210-1, . . . , 210-N via a plurality of channels and can be used to transfer information between the memory system 204 and a host 202. The interface 206 can be in the form of a standardized interface. For example, when the memory system 204 is used for information storage in a computing system 201, the interface 206 can be a serial advanced technology attachment (SATA), peripheral component interconnect express (PCIe), or a universal serial bus (USB), among other connectors and interfaces. In general, however, interface 206 can provide an interface for passing control, address, information, and other signals between the memory system 204 and a host 202 having compatible receptors for the interface 206.

Host 202 can be a host system such as a personal laptop computer, a desktop computer, a digital camera, a mobile telephone, or a memory card reader, among various other types of hosts. Host 202 can include a system motherboard and/or backplane and can include a number of memory access devices (e.g., a number of processors).

The controller 208 can communicate with the memory devices 210-1, . . . , 210-N to control information read, write, and erase operations, among other operations. Although not specifically illustrated, in some embodiments, the controller 208 can include a discrete memory channel controller for each channel coupling the controller 208 to the memory devices 210-1, . . . , 210-N. The controller 208 can include, for example, a number of components in the form of hardware and/or firmware (e.g., one or more integrated circuits) and/or software for controlling access to the number of memory devices 210-1, . . . , 210-N and/or for facilitating information transfer between the host 202 and memory devices 210-1, . . . , 210-N. The controller 208 can be configured to perform the operations described herein.

In some embodiments, and as illustrated in FIG. 2, the controller 208 can include a sensing signal generator 212. The sensing signal generator 212 can be a discrete component or can reflect functionality provided by circuitry within the controller 208 that does not necessarily have a discrete physical form separate from other portions of the controller 208. Although illustrated as a component within the controller 208 in FIG. 2, the sensing signal generator 212 can be external to the controller 208 or have a number of components located within the controller 208 and a number of components located external to the controller 208.

The memory devices 210-1, . . . , 210-N can include a number of arrays of memory cells (e.g., non-volatile memory cells). The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, information can be written to and/or read from a memory device of a memory system (e.g., memory devices 210-1, . . . , 210-N of system 204) as a page of information, for example. As such, a page of information can be referred to as an information transfer size of the memory system. Information can be transferred to/from a host (e.g., host 202) in information segments referred to as sectors (e.g., host sectors). As such, a sector of information can be referred to as an information transfer size of the host.

Although a page of information can include a number of bytes of user data (e.g., a data payload including a number of sectors of data) as well as metadata corresponding thereto, a size of a page of information often can refer only to the number of bytes of the user data. As an example, a page of information having a page size of 4 KB may include 4 KB of user data (e.g., 8 sectors assuming a sector size of 512B) as well as a number of bytes (e.g., 32B, 54B, 224B, etc.) of metadata corresponding to the user data. The metadata can include integrity data such as error data (e.g., error detecting and/or correcting code data) and/or address data (e.g., logical address data), among other metadata corresponding to the user data.

In a number of embodiments, the controller 208 can be configured to change a magnitude of an output of the sensing signal generator 212 serially through each of a first subset of a plurality of sensing magnitudes to read a first page of information from a number of MLCs in an array of memory cells (e.g., in a number of the memory devices 210-1, . . . , 210-N). The plurality of sensing signal magnitudes can include any number (e.g., seven) of different magnitudes. A subset of the plurality of sensing signal magnitudes can include any number less than the plurality of different magnitudes (e.g., one, three, etc.). Changing the output of the sensing signal generator serially through the subset can include changing the output in the order of the subset. For example, a subset of seven sensing signal magnitudes (e.g., R1-R7) can include three sensing signal magnitudes (e.g., R1, R3, and R6). Changing the output serially through the subset can include changing the output from R1 to R3 to R6, in this example. Thus, the output can be serial with respect to the subset, however it may not be consecutive with respect to a plurality of charge storage states of the MLC and/or the overall plurality of sensing magnitudes (e.g., R1, R2, R3, R4, R5, R6, and R7) in that the output of the sensing signal generator 212 may not be allowed to settle on (e.g., may skip) some of the sensing signal magnitudes (e.g., R2, R4, R5, and R7). The controller 208 can be configured to change the magnitude of the output of the sensing signal generator 212 serially through each of a second subset (or a third subset, fourth subset, etc.) of the plurality of sensing magnitudes to read a second page (or a third page, a fourth page, etc.) of information from the number of MLCs in the array. Each of the plurality of sensing magnitudes can correspond to a respective charge storage state for the number of MLCs. Such examples are described in more detail below with respect to FIGS. 4A-7.

The controller 208 can be configured to read respective pages of information in response to respective commands (e.g., commands received from the host 202). For example, the controller 208 can be configured to read a first page of information in response to a first command and to read a second page of information in response to a second command. Pages of information can include host data and/or error correction information (e.g., ECC data), among other information. In some embodiments, a number of pages of information can be read from an MLC storing at least a portion of a plurality of pages of information without reading all of the pages of information. In a number of embodiments, the controller 208 can be configured to read more than one (e.g., a first and a second) page of information in response to a single command. In various embodiments, a page of information can be stored as a non-integer number of units of information in each of a number of MLCs (e.g., fractional-bit memory cells).

Figure 3A:
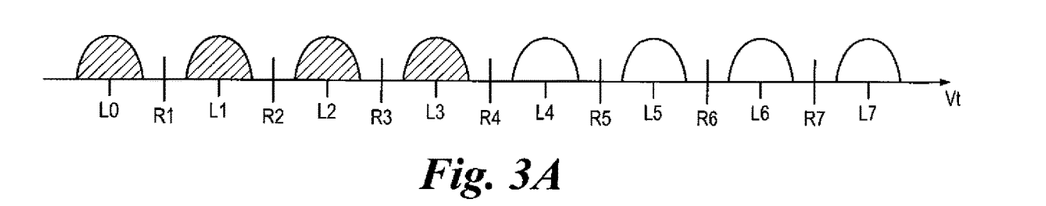
FIG. 3A illustrates a diagram of charge storage states and sensing magnitudes for a multilevel memory cell in accordance with a number of embodiments of the present disclosure.

FIG. 3A illustrates a diagram of charge storage states and sensing magnitudes for a multilevel memory cell in accordance with a number of embodiments of the present disclosure. Memory cells of an array can be single level cells (SLCs) or multi-level cells (MLCs). SLCs can be single-unit (e.g., two-state) memory cells. That is, the cells can be programmed to one of two charge storage states (e.g., L0 and L1, respectively). In operation, a number of memory cells can be programmed such that they have a charge storage (e.g., threshold voltage (Vt)) level corresponding to either L0 or L1. With respect to SLCs, for instance, charge storage state L0 can represent a stored information value such as binary "1," while charge storage state L1 can represent a stored information value such as binary "0".

MLCs can be two-unit (e.g., four-state), 2.25-unit (e.g., five-state), 2.5-unit (e.g., six-state), 2.75-unit (e.g., seven-state), three-unit (e.g., eight-state), or four-unit (e.g., sixteen state) memory cells, among other numbers of units of information. For instance, a two-unit memory cell can be programmed to one of four charge storage states (e.g., L0, L1, L2, L3), respectively. A three-unit memory cell can be programmed to one of eight charge storage states (e.g., L0, L1, L2, L3, L4, L5, L6, and L7), respectively. In operation, a memory cell can be programmed such that it has a charge storage state corresponding to one of L0, L1, L2, L3, L4, L5, L6, or L7. For instance, charge storage state L0 can represent a stored information value such as binary "111."

A number of sensing signal magnitudes (e.g., R1, R2, R3, R4, R5, R6, and R7) can be used to determine the charge storage state of a memory cell. According to some previous approaches to sensing a memory cell, a sensing signal can be applied to the memory cell. If the memory cell conducts in response to the applied sensing signal, then the charge storage state of the memory cell may be equal to or less than the magnitude of the sensing signal. With respect to FIG. 3A, if application of the sensing signal magnitude R1 causes the memory cell to conduct, then the charge storage state of the memory cell is L0. Thus, it can be said that sensing signal magnitude R1 corresponds to charge storage state L0. Charge storage states greater than L0 can be determined by application of a sensing signal with a greater magnitude (e.g., R2).

A sensing magnitude corresponding to a respective charge storage state for the MLC does not necessarily indicate that the sensing magnitude is used to sense the corresponding state, but rather can indicate that the sensing magnitude is adjacent to the corresponding charge storage state. For example, with respect to FIG. 3A, sensing magnitude R1 can correspond to charge storage state L0, sensing magnitude R2 can correspond to charge storage state L1, etc. Charge storage states L0, L1, L2, . . . , L7 (in order) can be said to be consecutive charge storage states. Sensing magnitudes R1, R2, . . . , R7 (in order) can be said to be consecutive sensing magnitudes.

Figure 3B:
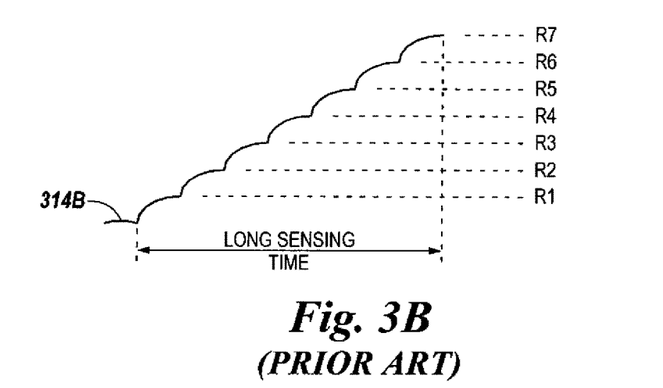
FIG. 3B illustrates a diagram of a sensing signal for a multilevel memory cell according to some previous approaches.

FIG. 3B illustrates a diagram of a sensing signal (314B) for a multilevel memory cell according to some previous approaches. According to some previous approaches, a sensing signal (314B) can be increased through a number of magnitudes (e.g., R1, R2, R3, R4, R5, R6, and R7) for a three-unit memory cell. The memory cell can store 3 bit/cell. The sensing operation can proceed by increasing the magnitude of the sensing signal (314B) through the number of magnitudes serially in sequence (e.g., from R1 to R2, . . . to R7). By increasing the magnitude of the sensing signal (314B) from R1 through R7, the charge storage state (e.g., L0, L1, L2, L3, L4, L5, L6, or L7) of the memory cell can be determined. As illustrated, the time for such a sensing operation may be relatively long as compared to a similar sensing operation performed on a two-unit memory cell as illustrated in FIG. 3C.

Figure 3C:
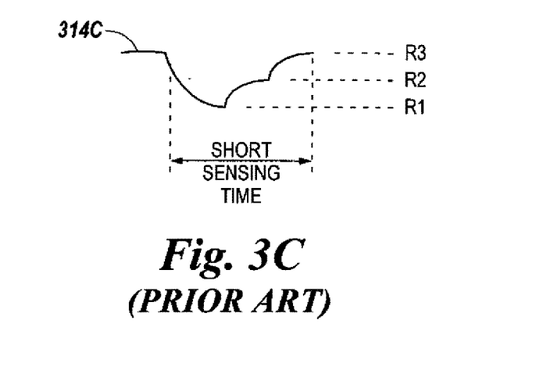
FIG. 3C illustrates a diagram of a sensing signal for a multilevel memory cell according to some previous approaches.

FIG. 3C illustrates a diagram of a sensing signal (314C) for a multilevel memory cell according to some previous approaches. According to some previous approaches, a sensing signal (314C) can be increased through a number of magnitudes (e.g., R1, R2, R3) for a two-unit memory cell. The memory cell can store 2 bit/cell. The sensing operation can proceed by increasing the magnitude of the sensing signal (314C) through the number of magnitudes serially in sequence (e.g., from R1 to R2 and from R2 to R3). By increasing the magnitude of the sensing signal (314C) from R1 through R3, the charge storage state (e.g., L0, L1, L2, or L3) of the memory cell can be determined. As illustrated, the time for such a sensing operation may be relatively short as compared to a similar sensing operation performed on a three-unit memory cell as illustrated in FIG. 3B.

Figure 4A:
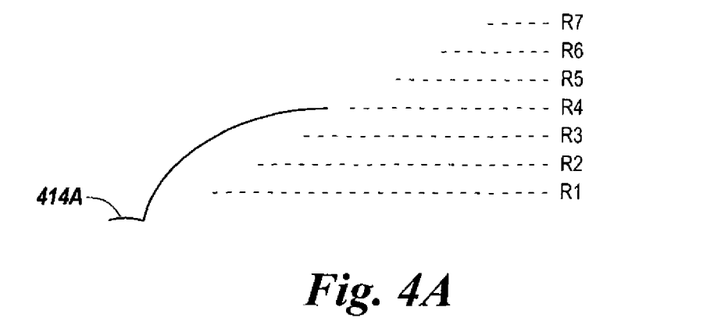
FIG. 4A illustrates a diagram of a first sensing signal for a multilevel memory cell in accordance with a number of embodiments of the present disclosure.

FIG. 4A illustrates a diagram of a first sensing signal (414A) for a multilevel memory cell in accordance with a number of embodiments of the present disclosure. The sensing signal (414A) can change from a starting magnitude to a particular magnitude (e.g., a fourth sensing magnitude, R4) corresponding to a respective charge storage state for an MLC. For example, the sensing magnitude R4 can be used, for a 3-unit MLC, to determine whether the charge storage state of the MLC is one of L0, L1, L2, and L3 or one of L4, L5, L6 and L7. If the MLC conducts in response to the sensing signal (414A) with the magnitude R4, then the MLC is in one of L0, L1, L2, and L3. However, if the MLC does not conduct in response to the sensing signal (414A) with the magnitude R4, then the MLC is in one of L4, L5, L6, and L7. According to a scheme for correlating units of information with charge storage states of a multilevel memory cell in accordance with a number of embodiments of the present disclosure (e.g., the scheme illustrated in FIG. 5), the sensing signal (414A) having the magnitude of R4 can be used to sense a first unit of information from the MLC. For example, a first unit of information of "1" can be correlated with charge storage states L0, L1, L2, and L3 while a first unit of information of "0" can be correlated with charge storage states L4, L5, L6, and L7. However, embodiments are not so limited, as the "1" and "0" could be correlated oppositely, and/or a second or third of the three units of information can be correlated with the charge storage states as described above. The first unit of information can correspond to (e.g., be a portion of) a page of information stored in a plurality of memory cells.

Figure 4B:
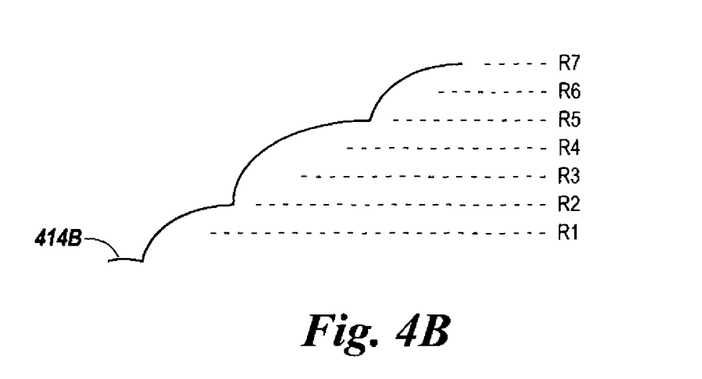
FIG. 4B illustrates a diagram of a second sensing signal for the multilevel memory cell in accordance with a number of embodiments of the present disclosure.
Figure 4C:
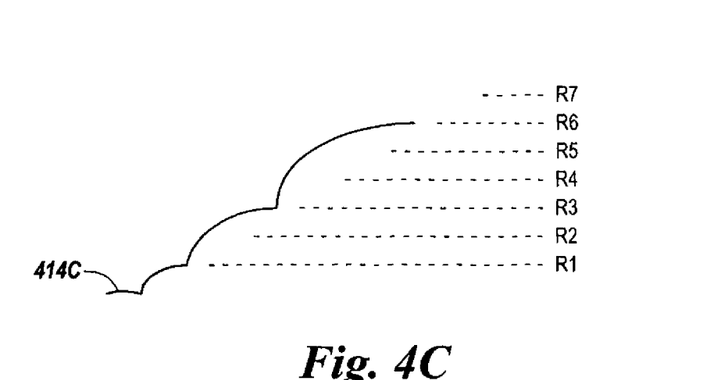
FIG. 4C illustrates a diagram of a third sensing signal for the multilevel memory cell in accordance with a number of embodiments of the present disclosure.

In some embodiments, the sensing signal (414A) illustrated in FIG. 4A can be used to read a page of information from a plurality of memory cells. The sensing signal (414A) illustrated in FIG. 4A can be part of one of a plurality of sensing operations used to read information from an MLC (e.g., a 3-unit MLC). For example, the sensing signals (414B, 414 C) illustrated in FIGS. 4B-4C can be others of the plurality of sensing operations for reading information from the MLC. A number of embodiments of the present disclosure can include selecting one of the plurality of sensing operations to read information from the MLC in response to a request for a particular page of information. That is, each of the sensing operations illustrated in FIGS. 4A-4C can be used to read a respective page of information from the MLC, and/or from a number of MLCs. The MLC can store a plurality of units of information corresponding to a plurality of pages of information (e.g., 3 units of information, each corresponding to one of three pages of information). Each of the plurality of sensing operations can correspond to a respective one of the plurality of pages of information (e.g., such that each sensing operation can read information from one of the plurality of pages of information without reading information from others of the plurality of pages of information). As is illustrated in FIGS. 4A-4C, the sensing signals (414A, 414B, 414 C) illustrated in each figure do not include a common sensing magnitude (e.g., the sensing signal is not allowed to settle at a common magnitude, although, for example, the sensing signal (414A) illustrated in FIG. 4A passes through magnitude R1 before settling at R4 and the sensing signal (414C) illustrated in FIG. 4C settles at R1). Each of the plurality of sensing operations may not include a sensing magnitude (e.g., may not settle on a sensing magnitude) for all of the potential charge storage states of the MLC.

FIG. 4B illustrates a diagram of a second sensing signal (414B) for the multilevel memory cell in accordance with a number of embodiments of the present disclosure. The sensing signal (414B) can change from a starting magnitude to a number of particular magnitudes (e.g., a second sensing magnitude, R2, a fifth sensing magnitude, R5, and a seventh sensing magnitude, R7) corresponding to respective charge storage states for an MLC. The sensing signal (414B) illustrated in FIG. 4B can be part of one of a plurality of sensing operations used to read information from an MLC (e.g., a 3-unit MLC).

FIG. 4C illustrates a diagram of a third sensing signal (414C) for the multilevel memory cell in accordance with a number of embodiments of the present disclosure. The sensing signal (414C) can change from a starting magnitude to a number of particular magnitudes (e.g., a first sensing magnitude, R1, a third sensing magnitude, R3, and a sixth sensing magnitude, R6) corresponding to respective charge storage states for an MLC. The sensing signal (414C) illustrated in FIG. 4C can be part of one of a plurality of sensing operations used to read information from an MLC (e.g., a 3-unit MLC).

In some embodiments, an MLC can store three units of information. In such embodiments, a first one of a plurality of sensing operations can be selected to sense a first one of the three units of information using a sensing signal of a first sensing magnitude (e.g., the sensing signal (414A) illustrated in FIG. 4A at R4). Selecting one of the plurality of sensing operations can include selecting a second one of the plurality of sensing operations (e.g., the sensing operation illustrated in association with the sensing signal (414B) illustrated in FIG. 4B, which changes from R2 to R5 to R7, for example) to sense a second one of the three units of information using a sensing signal that changes from a second sensing magnitude to a third sensing magnitude, and from the third sensing magnitude to a fourth sensing magnitude, where each sensing magnitude corresponds to a respective charge storage state for the MLC. Selecting one of the plurality of sensing operations can include selecting a third one of the plurality of sensing operations (e.g., the sensing operation illustrated in association with the sensing signal (414C) illustrated in FIG. 4C, which changes from R1 to R3 to R6, for example) to sense a third one of the three units of information using a sensing signal that changes from a fifth sensing magnitude to a sixth sensing magnitude, and from the sixth sensing magnitude to a seventh sensing magnitude. The use of the terms "first," "second," "third,"

etc., herein do not necessarily imply a consecutive order, but rather are used to distinguish one thing (such as a magnitude of a sensing signal or unit of information) from another. Thus, the language "a first one of the three units of information" and "a second one of the three units of information" does not imply that "the first one of the three units of information" must be the first of the three units of information in order. Rather the "first one of the three units of information" can be any one of the three units of information.

In a number of embodiments, a first page of information can be read from each of a number of MLCs with a first number of sensing magnitudes by increasing a magnitude of a sensing signal through each of the first number of sensing magnitudes. The first number of sensing magnitudes can include an order of sensing magnitudes that are nonconsecutive with respect to a plurality of consecutive charge storage states for the number MLCs. The magnitude of the sensing signal can be allowed to settle at each of the first number of sensing magnitudes. In some embodiments, the magnitude of the sensing signal can be allowed to settle at each of the first number of sensing magnitudes without allowing the magnitude of the sensing signal to settle at other sensing magnitudes. A second page of information can be read from each of the number of MLCs with a second number of sensing magnitudes.

Figure 5:
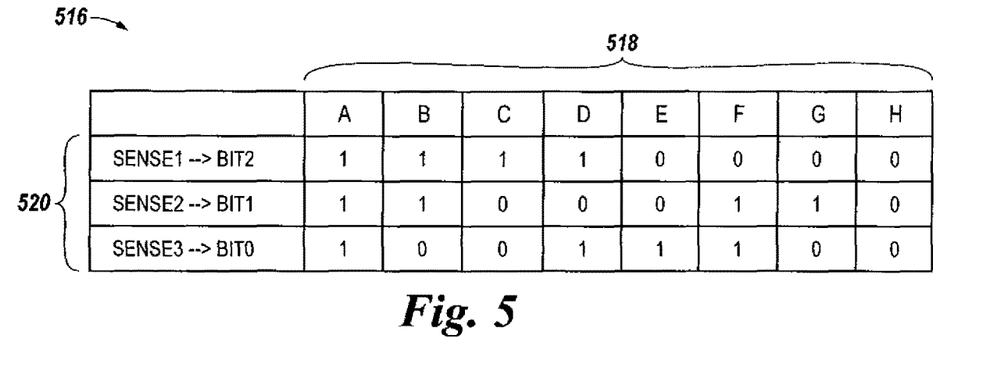
FIG. 5 illustrates a diagram of a scheme for correlating units of information with charge storage states of a multilevel memory cell in accordance with a number of embodiments of the present disclosure.

FIG. 5 illustrates a diagram 516 of a scheme for correlating units of information with charge storage states of a multilevel memory cell in accordance with a number of embodiments of the present disclosure. The columns 518 can represent the possible combinations of units of information stored in a 3-unit memory cell for the eight different possible charge storage states of the 3-unit memory cell. That is, a 3-unit memory cell can be programmed to one of eight charge storage states (e.g., A-H). Column A is a charge storage state representing the units of information 111, column B is a charge storage state representing the units of information 110, column C is a charge storage state representing the units of information 100, column D is a charge storage state representing the units of information 101, column E is a charge storage state representing the units of information 001, column F is a charge storage state representing the units of information 011, column G is a charge storage state representing the units of information 010, and column H is a charge storage state representing the units of information 000.

The rows 520 can represent the information sensed from the MLC by a particular sensing operation. The first row "Sense1" can represent the information sensed using the sensing operation illustrated and described with respect to FIG. 4A. For example, if "Sense1" is used to sense an MLC programmed to charge storage state A, then the unit of information "1" can be sensed from the MLC. The second row "Sense2" can represent the information sensed using the sensing operation illustrated and described with respect to FIG. 4B. The third row "Sense3" can represent the information sensed using the sensing operation illustrated and described with respect to FIG. 4C. In contrast to some previous approaches to sensing MLCs, any one of the three sensing operations can be used independently to sense the indicated information.

The charge storage states A, B, . . . , H can correspond, in order, to the charge storage states L0, L1, . . . , L7 illustrated in FIG. 3A. The sensing signal magnitudes R1, R2, . . . , R7 illustrated in FIGS. 4A-4C can have magnitudes between the charge storage states A, B, . . . , H, respectively. For example, R1 can be between A and B, R2 can be between B and C, etc.

The scheme for correlating units of information with charge storage states of an MLC illustrated in FIG. 5 can allow for independent sensing of information corresponding to different pages from an MLC without applying a discrete sensing signal magnitude and/or allowing a magnitude of a sensing signal to settle at each of the sensing signal magnitudes that are used to read information from the MLC, however embodiments are not limited to the specific scheme illustrated in FIG. 5. Although FIG. 5 is specific to a 3-unit memory cell, embodiments are not so limited, as one of ordinary skill in the art having read an understood the present disclosure could apply the scheme illustrated in FIG. 5 to MLCs storing other numbers of units of information.

Figure 6A:
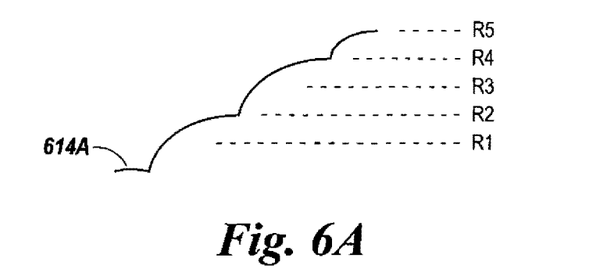
FIG. 6A illustrates a diagram of a first sensing signal for a multilevel memory cell in accordance with a number of embodiments of the present disclosure.

FIG. 6A illustrates a diagram of a first sensing signal (614A) for a multilevel memory cell in accordance with a number of embodiments of the present disclosure. The sensing signal (614A) can change from a starting magnitude to a number of particular magnitudes (e.g., a second sensing magnitude, R2, a fourth sensing magnitude, R4, and a fifth sensing magnitude, R5) corresponding to respective charge storage states for an MLC. The sensing signal (614A) illustrated in FIG. 6A can be part of one of a plurality of sensing operations used to read information from an MLC (e.g., a 2.5-unit MLC). For example, the sensing signals (614B) illustrated in FIG. 6B can be another of the plurality of sensing operations for reading information from the MLC.

Figure 6B:
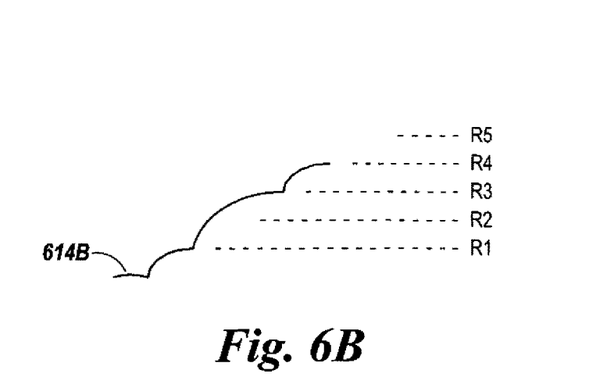
FIG. 6B illustrates a diagram of a second sensing signal for the multilevel memory cell in accordance with a number of embodiments of the present disclosure.

FIG. 6B illustrates a diagram of a second sensing signal (614B) for the multilevel memory cell in accordance with a number of embodiments of the present disclosure. The sensing signal (614B) can change from a starting magnitude to a number of particular magnitudes (e.g., a first sensing magnitude, R1, a third sensing magnitude, R3, and a fourth sensing magnitude, R4) corresponding to respective charge storage states for an MLC. In various embodiments, the first and the second numbers of sensing magnitudes can include, at most, one common sensing magnitude (e.g., with respect to FIGS. 6A-6B for 2.5-unit MLCs, the fourth consecutive sensing magnitude, R4, can be common to the first number of sensing magnitudes and the second number of sensing magnitudes). The sensing signal (614B) illustrated in FIG. 6B can be part of one of a plurality of sensing operations used to read information from an MLC (e.g., a 2.5-unit MLC).

A sensing signal can be changed from a first sensing magnitude to a second sensing magnitude and from the second sensing magnitude to a third sensing magnitude. In some embodiments, up to three units of information can be sensed collectively from two 2.5-unit MLCs with the changing sensing signal. The second sensing magnitude can be nonconsecutive from the first sensing magnitude and/or the third sensing magnitude can be nonconsecutive from the second sensing magnitude with respect to a plurality of charge storage states of an MLC. Each sensing magnitude can correspond to a respective charge storage state for the MLC. The changing sensing signal can be used to sense more than one unit of information from the MLC. The more than one unit of information can correspond to one page of information (e.g., possibly including other units of information stored in other MLCs). Each MLC can store a plurality of units of information corresponding to more than one page of information. In a number of embodiments, up to three units of information can be sensed from the two 2.5-unit memory cells without sensing a remainder of units of information stored collectively by the two MLCs. For example, the three units of information sensed from the two 2.5-unit memory cells can correspond to one page of information and the two 2.5-unit memory cells can store five units of information collectively, where the five units of information correspond to two pages of information. The three units of information can be sensed in response to a request for the corresponding page of information (e.g., from a host).

Figure 7:
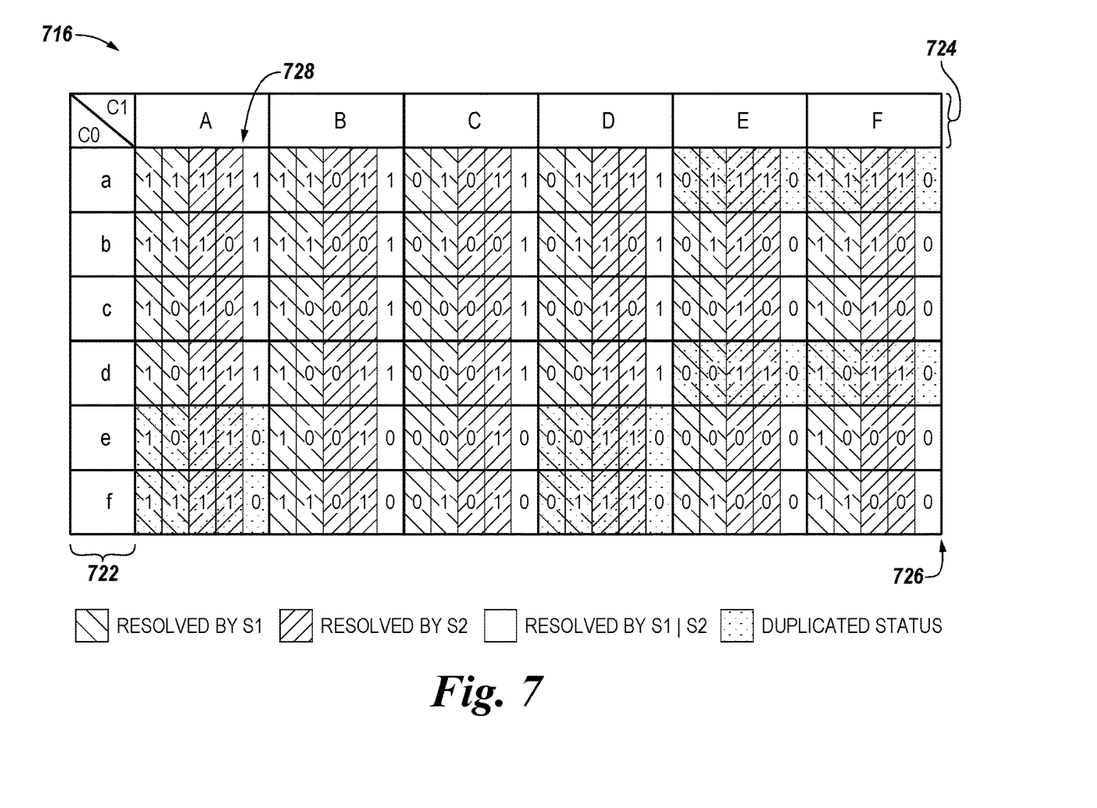
FIG. 7 illustrates a diagram of a scheme for correlating units of information with charge storage states of a number of multilevel memory cells in accordance with a number of embodiments of the present disclosure.

FIG. 7 illustrates a diagram 716 of a scheme for correlating units of information with charge storage states of a number of multilevel memory cells in accordance with a number of embodiments of the present disclosure. The diagram includes charge storage states for two MLCs (C0 and C1). The left side column 722 illustrates the six possible charge storage states for the first MLC (C0) (e.g., a, b, c, d, e, and f). The top row 724 illustrates the six possible charge storage states for the second MLC (C1) (e.g., A, B, C, D, E, and F). Each of the first and the second MLCs can store a non-integer number of units of information (e.g., 2.5 units of information represented by one of six charge storage states). The grid 726 between the charge storage states for MLCs C0 and C1 illustrates the combined 5-units of information represented collectively by the charge storage states of each MLC. For example, if MLC C0 is programmed to charge storage state "a" and MLC C1 is programmed to charge storage state A, then the two MLCs can collectively store the information "11111," as indicated by the corresponding grid member 728.

Each grid member includes 5 units of information. A particular sensing operation (e.g., the sensing operation illustrated and described with respect to FIG. 6A or FIG. 6B) can sense up to 3 of the 5 units of information from the two memory cells. As illustrated in FIG. 7, a first sensing operation "S1" can sense the first two units of information of each grid member while a second sensing operation "S2" can sense the second two units of information of each grid member. As is also illustrated, either sensing operation "S1" or sensing operation "S2" can sense the fifth unit of information of each grid member. Sensing operation "S1" can correspond to the sensing operation illustrated and described with respect to FIG. 6A and the sensing operation "S2" can correspond to the sensing operation illustrated and described with respect to FIG. 6B. In contrast to some previous approaches to sensing MLCs that store a non-integer number of units of information, either one of the two sensing operations can be used independently to sense the indicated information (e.g., without sensing a remainder of the information stored in the MLCs). In some embodiments, more than one unit of information can be sensed from each of two MLCs respectively with a changing sensing signal. In some embodiments, each of the two MLCs can store a non-integer number of units of information.

The charge storage states a, b, . . . , f and the charge storage states A, B, . . . , F can both correspond, in order, to the charge storage states L0, L1, . . . , L5 illustrated in FIG. 3A. The sensing signal magnitudes R1, R2, . . . , R5 illustrated in FIGS. 6A-6B can have magnitudes between the charge storage states a, b, . . . , f and the charge storage states A, B, . . . , F, respectively. For example, R1 can be between "a" and "b" or between A and B, R2 can be between "b" and "c" or between B and C, etc. The scheme for correlating units of information with charge storage states of a pair of MLCs, each storing a non-integer number of units of information illustrated in FIG. 7 can allow for independent sensing of information corresponding to different pages from the pair of MLCs without applying a discrete sensing signal magnitude and/or allowing a magnitude of a sensing signal to settle at each of the sensing signal magnitudes that are used to sense information from the pair of MLCs.

Although FIG. 7 is specific to a 2.5-unit MLCs, embodiments are not so limited, as one of ordinary skill in the art having read an understood the present disclosure could apply the scheme illustrated in FIG. 7 to MLCs storing other non-integer numbers of units of information.

A legend for the diagram (716) appears under the grid (726) illustrated in FIG. 7. The legend illustrates the patterns corresponding to the patterns appearing in some of the cells of the grid (726) of the diagram (716). Illustrated in the legend next to each pattern is a brief statement of the status (e.g., RESOLVED BY S1, RESOLVED BY S2, RESOLVED BY S1/S2, AND DUPLICATED STATUS) corresponding to the status associated with the contents of the cells of the grid (726) having that pattern.

CONCLUSION

The present disclosure includes apparatuses and methods for nonconsecutive sensing of multilevel memory cells. A number of methods include sensing a unit of information from a multilevel memory cell (MLC) using a sensing signal. The unit of information can correspond to a page of information. The MLC can store a plurality of units of information corresponding to a plurality of pages of information. The sensing signal can change from a first sensing magnitude to a second sensing magnitude and from the second sensing magnitude to a third sensing magnitude. The second sensing magnitude can be nonconsecutive from the first sensing magnitude and/or the third sensing magnitude can be nonconsecutive from the second sensing magnitude with respect to a plurality of sensing magnitudes corresponding to a plurality of charge storage states of the MLC.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    selecting one of a plurality of predefined sensing operations to sense a unit of information from a multilevel memory cell (MLC) corresponding to a page of information, wherein:
    each one of the plurality of predefined sensing operations uses a different sensing signal to sense the page of information regardless of a charge storage state of the MLC,
    at least one single predefined sensing operation of the plurality of predefined sensing operations includes applying the different sensing signal continuously such that a magnitude of the different sensing signal settles on a second sensing magnitude, then skips a first sensing magnitude, and then settles on a third sensing magnitude,
    the first sensing magnitude is between the second sensing magnitude and the third sensing magnitude,
    the first sensing magnitude corresponds to a first charge storage state of the MLC, the second sensing magnitude corresponds to a second charge storage state of the MLC, and the third sensing magnitude corresponds to a third charge storage state of the MLC, and
    the first and third charge storage states of the MLC are nonconsecutive.

2. The method of claim 1, wherein:
    the MLC stores three units of information corresponding to three pages of information,
    selecting one of the plurality of predefined sensing operations comprises selecting a first predefined sensing operation of the plurality of predefined sensing operations to sense a first one of the three pages of information, and
    during the first predefined sensing operation, the different sensing signal settles on the first sensing magnitude.

3. The method of claim 2, wherein:
    selecting one of the plurality of predefined sensing operations comprises selecting a second predefined sensing operation of the plurality of predefined sensing operations to sense a second one of the three units of information, and
    during the second predefined sensing operation, the different sensing signal is applied continuously with a magnitude that changes from the second sensing magnitude and settles on the third sensing magnitude, and changes from the third sensing magnitude and settles on a fourth sensing magnitude corresponding to a fourth charge storage state of the MLC.

4. The method of claim 3, wherein:
    selecting one of the plurality of predefined sensing operations comprises selecting a third predefined sensing operation of the plurality of predefined sensing operations to sense a third one of the three units of information, and
    during the third predefined sensing operation, the different sensing signal is applied continuously with a magnitude that changes from a fifth sensing magnitude corresponding to a fifth charge storage state of the MLC and settles on a sixth sensing magnitude corresponding to a sixth charge storage state of the MLC, and changes from the sixth sensing magnitude and settles on a seventh sensing magnitude corresponding to a seventh charge storage state of the MLC.

5. An apparatus, comprising:
    an array of multilevel memory cells (MLCs);
    a sensing signal generator; and
    a controller coupled to the array and to the sensing signal generator and configured to perform a plurality of predefined sensing operations on the array of MLCs to sense pages of information, each predefined sensing operation including a respective different sequence of sensing magnitudes regardless of respective charge storage state of the MLCs, wherein:
- at least one single predefined sensing operation of the plurality of predefined sensing operations includes continuous application of a sensing signal through a sequence of the sensing magnitudes to sense a page of information in which the sensing signal settles on a first one of the sensing magnitudes prior to settling on a second one of the sensing magnitudes,
- the second one of the sensing magnitudes is greater than the first one of the sensing magnitudes, a third one of the sensing magnitudes, and a fourth one of the sensing magnitudes,
- the third and fourth ones of the sensing magnitudes are greater than the first one of the sensing magnitudes and less than the second one of the sensing magnitudes,
- the MLCs of the array have charge storage states, each charge storage state corresponding to a respective one of the sensing magnitudes, and
- the charge storage states corresponding to the first and second ones of the sensing magnitudes are nonconsecutive.

6. The apparatus of claim 5, wherein the first one of the sensing magnitudes is greater than a lowest one of the sensing magnitudes.

7. The apparatus of claim 5, wherein:
each MLC of the array stores three units of information corresponding to three pages of information, and
the controller is configured to perform each one of the plurality of predefined sensing operations to sense a respective one of the three pages of information.

8. The apparatus of claim 5, wherein each one of the plurality of predefined sensing operations includes a different sequence of the sensing magnitudes in which the sensing signal settles on a subset of the sensing magnitudes corresponding to a subset of the charge storage states.

9. The apparatus of claim 5, wherein each MLC of the array is configured to store a non-integer number of units of information.

10. The apparatus of claim 5, wherein the sensing signal generator comprises a component within the controller.

11. The apparatus of claim 5, wherein the sensing signal generator is external to the controller.

12. The apparatus of claim 5, wherein the sensing signal generator comprises a number of components located within the controller and a number of components located external to the controller.

13. An apparatus, comprising:
an array of multilevel memory cells (MLCs);
a sensing signal generator; and
a controller coupled to the array and to the sensing signal generator and configured to select one of a plurality of predefined sensing operations to sense a page of information from the MLCs of the array, each predefined sensing operation including application of a different sensing signal regardless of a charge storage state of the MLC, wherein:
- at least one single predefined sensing operation of the plurality of predefined sensing operations includes continuous application of the different sensing signal during which a magnitude of the different sensing signal settles on a second sensing magnitude, then skips a first sensing magnitude, and then settles on a third sensing magnitude,
- the first sensing magnitude is between the second sensing magnitude and the third sensing magnitude,
- the first sensing magnitude corresponds to a first charge storage state of the MLC and the third sensing magnitude corresponds to a second charge storage state of the MLC, and
- the first and second charge storage states of the MLC are nonconsecutive.

14. The apparatus of claim 13, wherein:
each MLC of the array stores three units of information corresponding to three pages of information,
the controller is configured to select a first predefined sensing operation of the plurality of predefined sensing operations to sense a first one of the three pages of information, and
during the first predefined sensing operation, the different sensing signal settles on the first sensing magnitude.

15. The apparatus of claim 14, wherein:
the controller is configured to select a second predefined sensing operation of the plurality of predefined sensing operations to sense a second one of the three pages of information, and
during the second predefined sensing operation, the different sensing signal that changes from the second sensing magnitude and settles on the third sensing magnitude, and changes from the third sensing magnitude and settles on a fourth sensing magnitude.

16. The apparatus of claim 15, wherein:
the controller is configured to select a third predefined sensing operation of the plurality of predefined sensing operations to sense a third one of the three pages of information, and
during the second predefined sensing operation, the different sensing signal that changes from a fifth sensing magnitude and settles on a sixth sensing magnitude, and from the sixth sensing magnitude and settles on a seventh sensing magnitude.

17. The apparatus of claim 13, wherein the controller is configured to provide random access to the MLCs of the array.

* * * * *